United States Patent
Khiang et al.

(10) Patent No.: US 8,288,862 B2
(45) Date of Patent: Oct. 16, 2012

(54) MULTIPLE DIE STACK PACKAGE

(75) Inventors: Wang Chuen Khiang, Singapore (SG);
Koh Yong Chuan, Singapore (SG);
Fong Kok Chin, Singapore (SG)

(73) Assignee: United Test & Assembly Center Limited, Singapore (SG)

( * ) Notice: Subject to any disclaimer, the term of this patent is extended or adjusted under 35 U.S.C. 154(b) by 2376 days.

(21) Appl. No.: 10/361,814

(22) Filed: Feb. 11, 2003

(65) Prior Publication Data

US 2003/0197284 A1   Oct. 23, 2003

(30) Foreign Application Priority Data

Feb. 21, 2002   (SG) ................. 200201096-5

(51) Int. Cl.
*H01L 21/02* (2006.01)

(52) U.S. Cl. ........ 257/706; 257/713; 257/723; 257/777; 257/782; 257/E23.092; 257/E23.106; 257/E23.135; 257/E23.146; 257/E23.194

(58) Field of Classification Search .......... 257/685–686, 257/777–784, 706–713, 723, E23.052, 92, 257/101, 106, 135, 146, 194

See application file for complete search history.

(56) References Cited

U.S. PATENT DOCUMENTS

| | | | |
|---|---|---|---|
| 5,291,061 A | 3/1994 | Ball | |
| 5,323,060 A | 6/1994 | Fogal et al. | |
| 5,952,725 A | 9/1999 | Ball | |
| 5,998,860 A * | 12/1999 | Chan et al. | 257/679 |
| 6,091,140 A * | 7/2000 | Toh et al. | 257/691 |
| 6,118,176 A | 9/2000 | Tao et al. | |
| 6,258,626 B1 | 7/2001 | Wang et al. | |
| 6,313,527 B1 * | 11/2001 | Han et al. | 257/723 |
| 6,343,019 B1 * | 1/2002 | Jiang et al. | 361/761 |
| 6,452,279 B2 * | 9/2002 | Shimoda | 257/777 |
| 6,472,736 B1 * | 10/2002 | Yeh et al. | 257/686 |
| 6,531,784 B1 * | 3/2003 | Shim et al. | 257/777 |
| 6,545,366 B2 * | 4/2003 | Michii et al. | 257/777 |
| 6,650,009 B2 | 11/2003 | Her et al. | |
| 6,825,571 B2 * | 11/2004 | Taniguchi | 257/783 |
| 7,161,239 B2 * | 1/2007 | Zhao et al. | 257/707 |
| 2002/0005577 A1 | 1/2002 | Shimoda | |
| 2002/0105067 A1 * | 8/2002 | Oka et al. | 257/686 |
| 2002/0172024 A1 * | 11/2002 | Hui et al. | 361/767 |
| 2002/0180057 A1 * | 12/2002 | Lee et al. | 257/777 |
| 2003/0146503 A1 * | 8/2003 | Khan et al. | 257/706 |

FOREIGN PATENT DOCUMENTS

| | | |
|---|---|---|
| JP | 54-150078 | 11/1979 |
| TW | 445599 | 7/2001 |

OTHER PUBLICATIONS

U.S. Appl. No. 10/347,356 to Khiang, entitled "Multiple Chip Semiconductor Packages", filed Jan. 21, 2003.
English Language Abstract of JP 54-150078.

* cited by examiner

*Primary Examiner* — Michael Lebentritt
(74) *Attorney, Agent, or Firm* — Greenblum & Bernstein P.L.C.

(57) ABSTRACT

A semiconductor package, containing two or more stacked IC devices attached to a substrate. Each of the IC devices has a plurality of electrical contact regions which are connected to the substrate by means of electrical connections.

10 Claims, 5 Drawing Sheets

MULTIPLE DIE STACK PACKAGE

The invention relates to a semiconductor package, specifically to a so-called Chip Scale Package (CSP).

The rapid growth of portable electronics and wireless communications apparatus has necessitated rapid development in the field of packaging semiconductor devices (also referred to as Integrated Circuits or ICs). A major area of development is the emergence of a class of new technology referred to as Chip Scale Packaging (CSP). The definition of CSP, as given by the Institute for Interconnecting and Packaging Electronic Circuits (IPC) refers to a package area which is less than 1.5 times that of the chip area. CSPs are especially used at present in memory IC devices. The intention is to maximise the capability and capacity of a device whilst minimising the package size. Thus the density of the package is increased.

FIG. 1 of the accompanying drawings shows a sectional view of a particular variant of a CSP device, a Fine Pitch Ball Grid Array (FPBGA). The package is comprised of an IC device 1, attached by means of an adhesive 4 to a substrate 3. The IC device 1 is electrically connected through an electrical contact region 2, referred to as electric bond pads, on the active surface of the IC device. Electrical connections 8 connect the electrical contact region 2 to the substrate 3, allowing communication of signals between the IC device and the external apparatus. The substrate 3 has conductive traces 6, 7 which provide electrically conducting links between the point of contact between the electrical connections 8 and the substrate 3 to solder balls 9 which, when the package is mounted in a piece of apparatus, provide the signal transferring interface between the package and the apparatus. The electrical connections 8 may be effected by wire bonding or by Tape Automatic Bonding (TAB) which uses ribbons of electrically conducting material. The substrate 3 has an opening 11 through which the electrical connections 8 pass from a first side 3a of the substrate on which the IC device 1 is located to a second side 3b of the substrate on which the signal transfer interface solder balls 9 are located. The IC device is encapsulated by a cover 5, a protruding portion 5a of which encapsulates the electrical connections 8.

FIG. 2 of the accompanying drawings shows a variant of the package shown in FIG. 1. This semiconductor package 20 is similar to the package shown in FIG. 1 and the corresponding description is not repeated. The semiconductor package 20 includes the IC device 21 attached by an adhesive 24 to a substrate 23. In this case, the encapsulating cover 25 is reduced such that the passive side 21b of the IC device 21 is exposed. This may assist in cooling the IC device 21.

A problem with this conventional packaging arrangement is that the scope for further reducing the ratio of the package area to the chip area is limited. There must always be some encapsulant 5, 25 around the periphery of the IC device 1, 21 to prevent accidental damage. Consequently the package area must be larger than the chip area. It is therefore an object of the present invention to provide a means for which the ratio of the package area to the chip area can be reduced.

According to the present invention, there is provided a semiconductor package comprising:
a first IC device;
a second IC device; and
a substrate;
wherein the first IC device is attached to the substrate and the second IC device is attached to the first IC device; the semiconductor package further comprising a first electrical connection between the first IC device and the substrate and a second electrical connection between the second IC device and the substrate.

This is advantageous since by packaging two IC devices in a single semiconductor package the ratio of the package area to the chip area may be significantly reduced and may even be brought below 1.0. The package size may be almost the same as in conventional packages (there may be some increase in the package height) but, using two memory chips for example, will yield a package with approximately double the memory density. Furthermore, this invention enables semiconductor packages to be produced which incorporate IC devices which perform different functions (for example processing and memory). Further, the likelihood of an IC device being produced that meets the required quality standard decreases as the size of the IC device increases (as the number of opportunities for error in the device increases). Consequently, it is cheaper to produce two devices of a given size than it is to produce a single device of twice the size (due to reduced wastage, for example). A package containing two IC devices, therefore, may have the same capacity and/or capability as a semiconductor package containing a single device, but it may be cheaper to produce and may have a smaller package area.

According to a further embodiment of the present invention, the substrate is attached to a first major face of the first IC device and the second IC device is attached to the second major face of the first IC device. He two IC devices therefore form a stack, with the result that the package area may be minimised to a little more than the area of one of the IC devices. This is advantageous as the ratio of the package area to the total IC device area may be reduced to between 0.5 and 1.0

Preferably, the substrate comprises one or more openings through which the first, and where required, additional electrical connections pass to connect electrical contact region(s) on the first IC device to the opposite side of the substrate than that to which the first IC device is attached.

The electrical contact regions may be arranged to be in convenient locations. Preferably, for example, the electrical contact regions may be arranged as a row in the centre of the side of the IC device that is attached to the substrate or may be located on mutually opposite edges of the face of the IC device attached to the substrate. This may be advantageous for arranging the layout of the signal transfer interface solder balls on the opposite side of the substrate.

Similarly the arrangement of the electrical contact regions on the second IC device may be varied but, preferably, they may be located in the centre or on mutually opposite edges of the face of the second IC device that is opposite to the face of the second IC device which is attached to the first IC device. This facilitates the establishment of electrical connections between the second IC device and the substrate.

Preferably, the semiconductor package contains at least a third IC device, the third IC device being attached to the second IC device by way of a spacer. Any subsequent IC devices may also attached by way of a spacer. The spacer ensures that each IC device does not interfere with the electrical contacts between other IC devices and the substrate. Adding additional IC devices is advantageous as it may multiply the advantages of the package containing two IC devices without necessarily substantially increasing the package areas.

In a preferred embodiment of the present invention, an electrical contact distribution element may be attached to one or more of the IC devices in the package. The electrical contact distribution element is used to provide an electrical contact between the electrical contact region on the relevant IC device and the electrical connection which is connected to the substrate. Such an element may be useful for reducing the complexity of attaching the electrical connections and ensuring that, especially in packages containing multiple IC devices, the electrical connections do not interfere with one another. The electrical contact distribution element may take the form of a wafer distribution layer, a substrate interposer, a dielectric interposer or a metallic interposer. Depending on the circumstances, each of these may be more convenient due to the ease of manufacture, the ease of assembling the element to the IC device, or the ease of attaching the electrical connections to it.

The invention will now be described by way of non-limiting examples with reference to the accompanying drawings in which:

FIG. 4b is a fragmentary view of a variation of the chip scale package shown in FIG. 4a;

In the figures, like parts have similar reference numerals.

Figure 1:
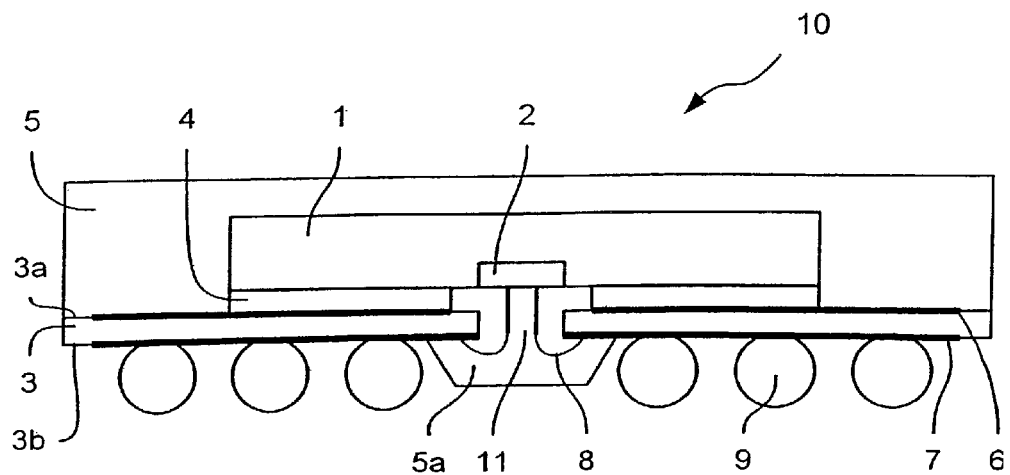
FIG. 1 is a sectional view of a conventional chip scale package.
Figure 2:
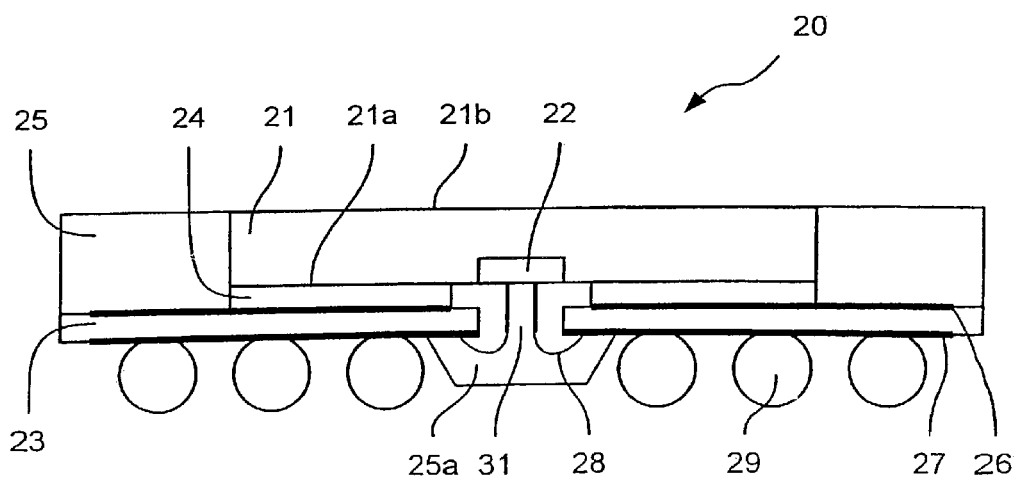
FIG. 2 is a sectional view of a variant of the chip scale package shown in FIG. 1.
Figure 3:
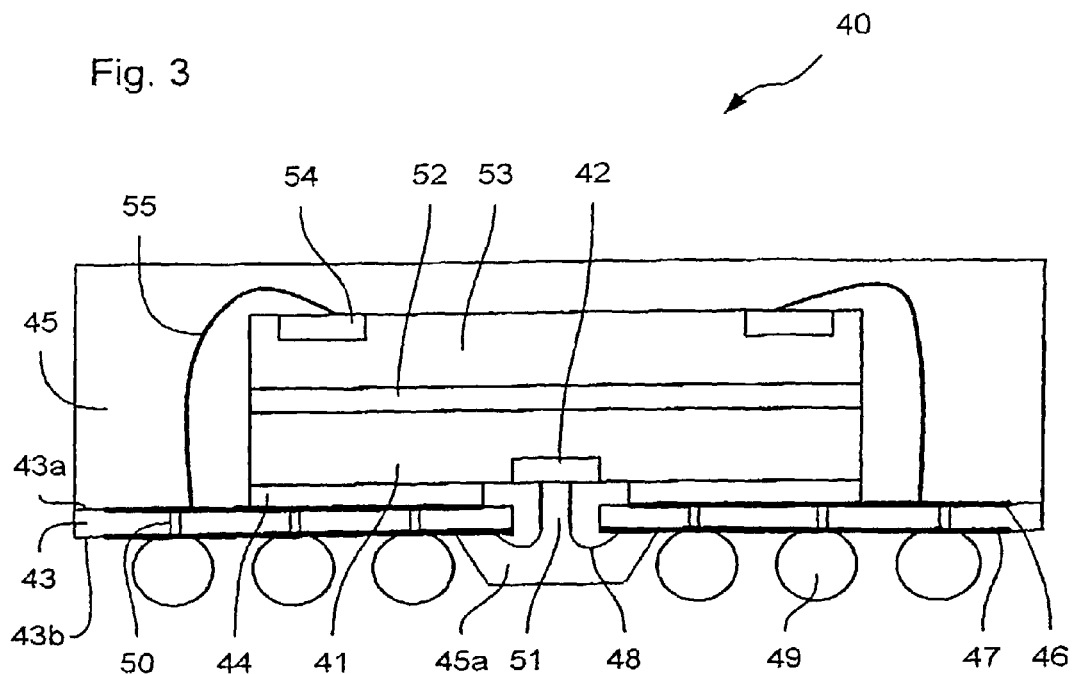
FIG. 3 is a sectional view of a chip scale package according to the present invention.

FIG. 3 shows a sectional view of a semiconductor package 40 according to the present invention. A first IC device 41 is attached by an adhesive 44 to a first side 43a of a substrate 43. Signal transferring interface solder balls 49 are attached to the second side 43b of the substrate 43. These solder balls 49 form the interface between the semiconductor package 40 and the apparatus onto which it is mounted. Conductive traces 47 are arranged on the second side 43b of the substrate 43 to provide electrical connections between the solder balls 49 and the first IC device 41. The conductive traces 47 connect to electrical contact 48 which pass though an opening 51 in the substrate 43. The electrical contacts 48 are connected to an electrical contact region 42 (also referred to as a bond pad) on the first IC device 41. A second IC device 53 is attached to the first IC device 41 by means of an adhesive 52. The first IC device 41 is arranged such that its active face is attached to the substrate 43. Therefore, the passive face of the first IC device 41 is uncovered and it is to this that the passive face of the second IC device 53 is attached. Electrical contact regions 54 on the active face of the second IC device 53 are linked to the solder balls 49 by means of additional electrical connections 55. These electrical connections 55 are connected to the electrical contact regions 54 on the second IC device 53 and to conductive traces 46 on the first surface 43a of the substrate 43. The conductive traces 47 on the first surface 43a of the substrate 43 are connected to the conductive traces 47 on the second surface 43b of the substrate 43 by means of vias 50 and thence to the solder balls 49. The first IC device 41 and the second IC device 53 are encapsulated in a cover 45 which may, for example be molded after the IC devices 41, 53 have been attached to the substrate 43. The cover 45 also encapsulates the electrical connections 55, a protruding part 45a of the cover also filling the opening 51 in the substrate 43 and encapsulating the electrical connections 48 between the first IC device and the lower side 43b of the substrate 43.

Figure 4A:
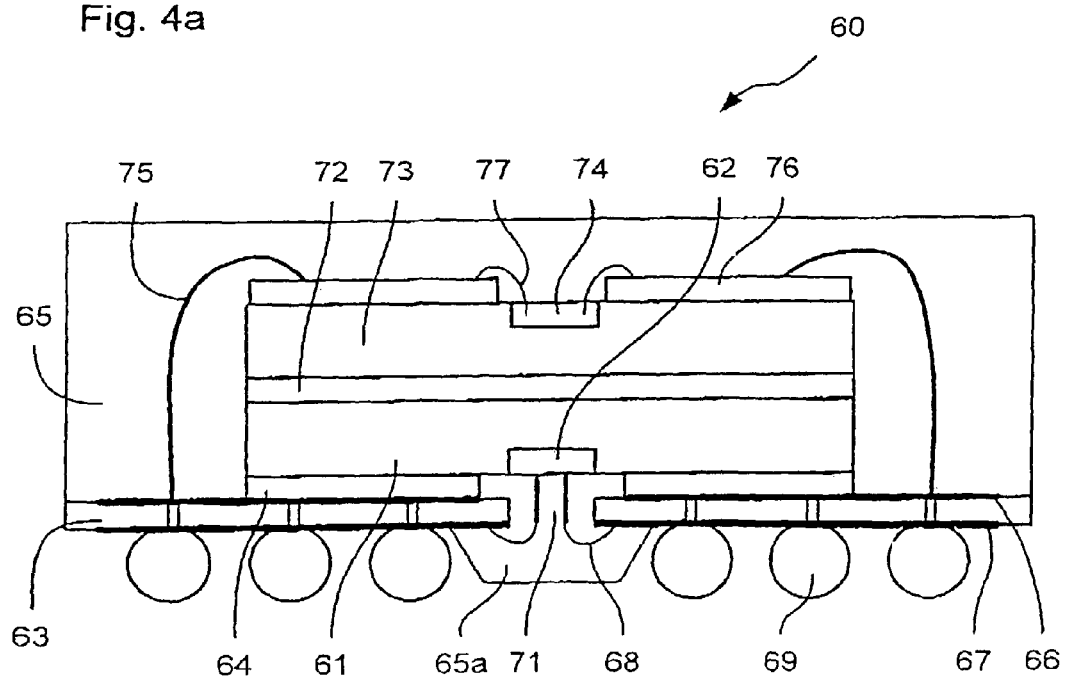
FIG. 4a is a sectional view of a variation of the chip scale package shown in FIG. 3.
Figure 4B:
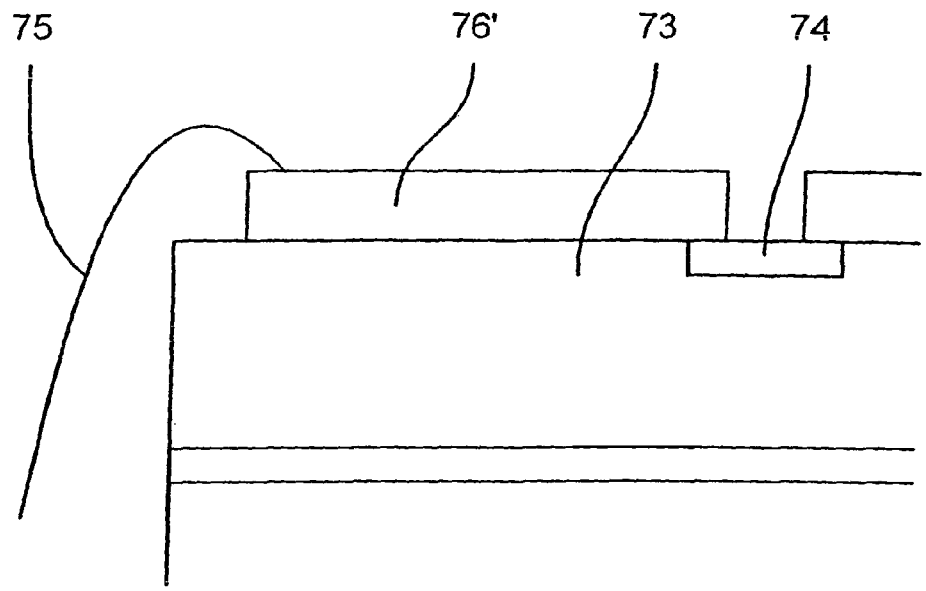
Figure 5:
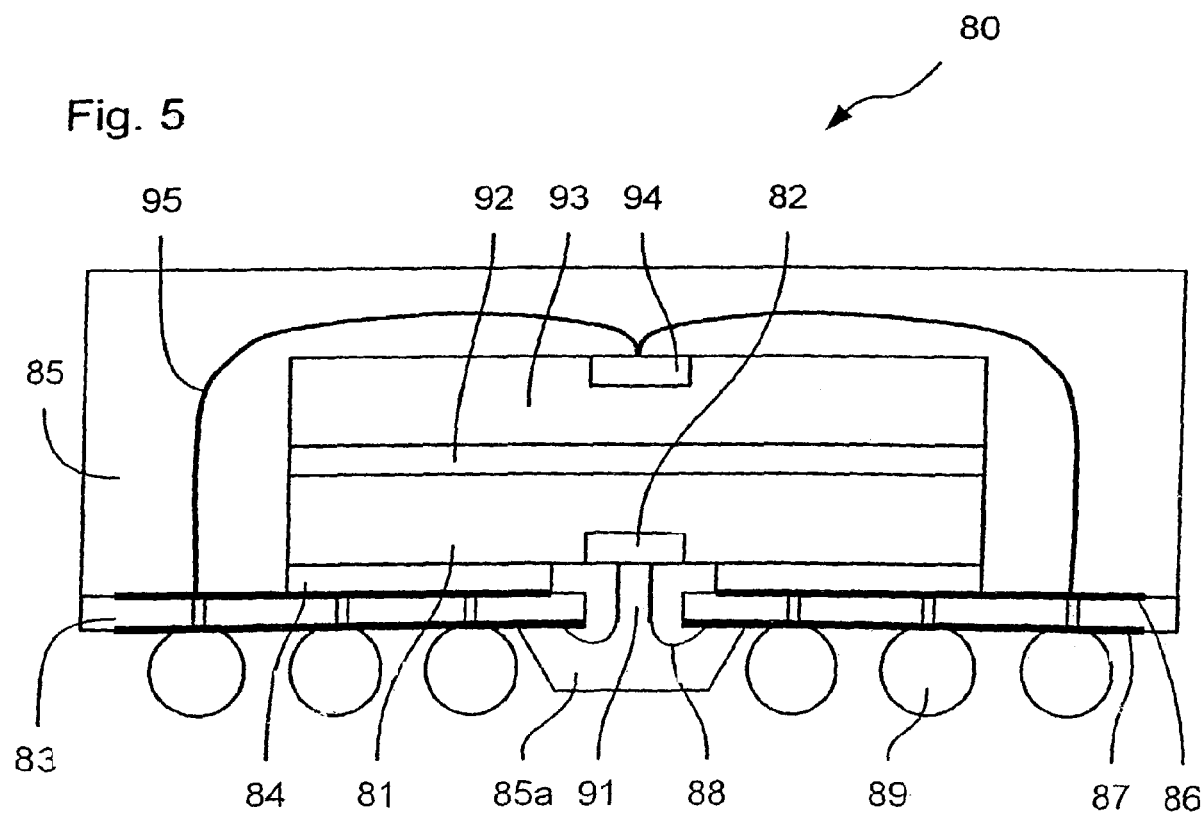
FIG. 5 is a sectional view of a further variation of the chip scale package shown in FIG. 3.

FIGS. 4 and 5 show semiconductor packages 60, 80, respectively, that are similar to the semiconductor package 40 shown in FIG. 3. The description of the similar components will not be repeated. The semiconductor package 60 includes the IC device 61 attached by an adhesive 64 to a substrate 63. The semiconductor package 80 includes the IC device 81 attached by an adhesive 84 to a substrate 83. The variation between the semiconductor packages 40, 60, 80 shown in FIGS. 3, 4, and 5, respectively, lies in the arrangement of the electrical connections to the second IC device 53, 73, 93. In each case parallel row(s) of electrical contact regions 54, 74, 94 are provided on the active surface of the second IC device. The semiconductor package 40, shown in FIG. 3, has electrical contact regions 54 on opposite sides of the active face of the second IC device 53. These provide convenient access for the electrical connections 55 that are connected to them. In FIG. 4 and FIG. 5, the electrical contact regions 74, 94, respectively are arranged in the centre of the active face of the IC devices 73, 93, respectively. In the semiconductor 80 shown in FIG. 5, the electrical connections 95 necessarily must reach further to establish the required connections. This increases the chance of one of the electrical connections 95 interfering with another electrical connection or with the operation of the second IC device 93.

The semiconductor package 60 shown in FIG. 4a has electrical contact distribution elements 76 that provide an electrical connection between the electrical contact region 74 located in the centre of the IC device 73 and the electrical connections 75 which may therefore be connected at the edge of the IC device 73. This facilitates the attachment of the electrical connections 75 and reduces the risk of interference of the electrical connections. The electrical contact distribution elements 76 may be one of the following: an additional wafer layer, known as a wafer Redistribution Layer (RDL), which is an additional layer within the IC device; a dielectric interposer, comprised of, for example, a conductive pattern etched or deposited on a piece of silicon wafer that is attached to the IC device 73; a substrate interposer, comprised of a piece of substrate with a plurality of conductive traces set out upon it that is attached to the active surface of the IC device 73; or a metallic interposer, comprised of a plurality of conductive traces attached directly to the active surface of the IC device 73.

In embodiments where the electrical distribution elements 76 are not integral to the IC device 73, the electrical contact region 74 may be connected to the electrical distribution elements 76 by means of electrical connections 77 such as those shown in FIG. 4a. Alternatively, the electrical distribution elements 76' may be in direct electrical contact with the electrical contact regions 74, as shown in the fragmentary view of FIG. 4b.

Figure 6:
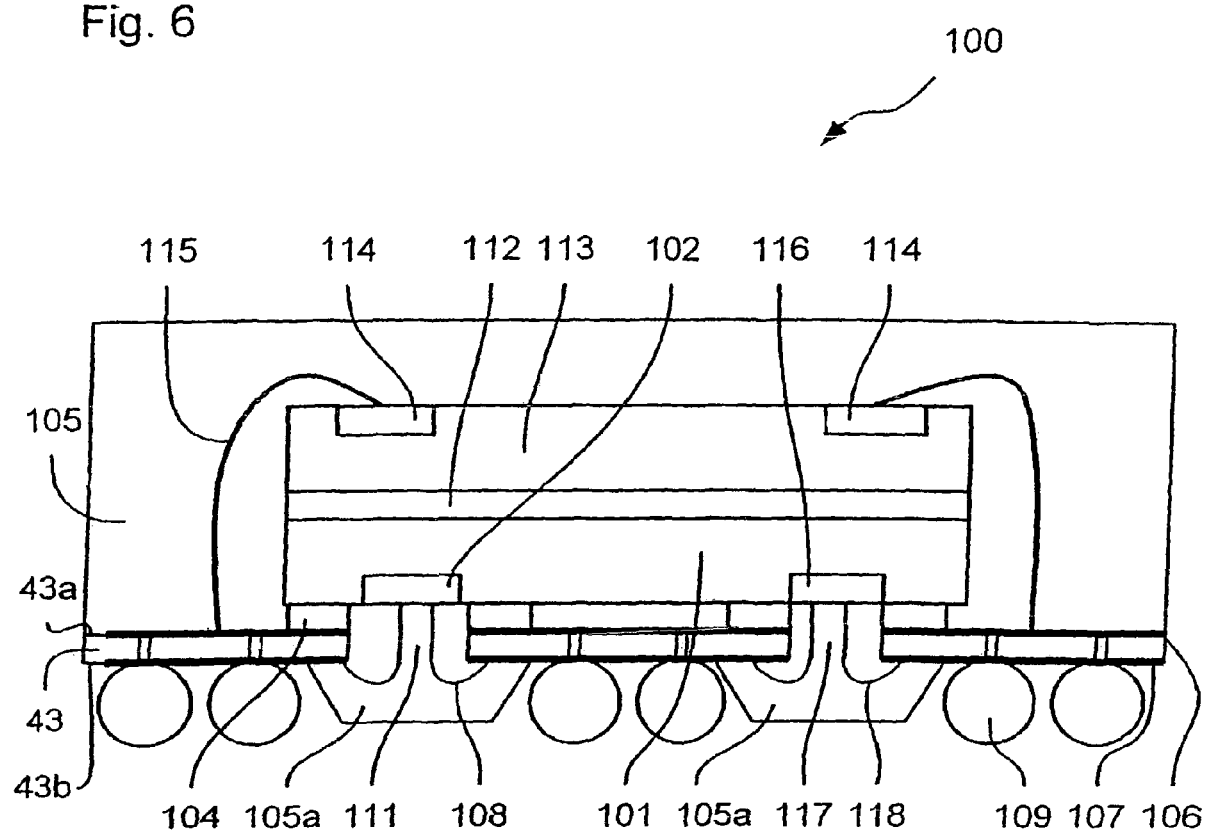
FIG. 6 is a sectional view of a yet further variation of the chip scale package shown in FIG. 3.

FIG. 6 shows a sectional view of a semiconductor package 100 that is a further variation of the semiconductor package 40 shown in FIG. 3. The semiconductor package 100 of FIG. 6 includes the IC device 101 attached by an adhesive 104 to a substrate 43. In the semiconductor package 40 of FIG. 3, the electrical contact regions 42 are arranged in a row located in the center of the active face of the first IC device 41. In the semiconductor package 100 of FIG. 6, the electrical contact regions 102, 116 are arranged on opposite edges of the active face of the first IC device 101. This may assist, especially where large numbers of connections are required in reducing the complexity of the conductive traces 107 required on the lower face 43b of the substrate 43 to connect the solder balls 109 to the respective contacts in the IC devices. The semiconductor package 100 of FIG. 6 has openings 111, 117 in the substrate 43. The openings may take the form of a single opening corresponding to an entire row or a plurality of openings, for example each corresponding to a single electrical contact region. The first opening(s) 111, lines up with first electrical contact region(s) 102 on the active face of the first IC device 101 and the second openings(s) 117 lines up with the second electrical contact region(s) 116 on the active face of the first IC device 101. Electrical connections 108, 118 connect the conductive traces 107 on the second surface 103b of the substrate 103 to the electrical contact regions 102, 116, respectively.

Figure 7:
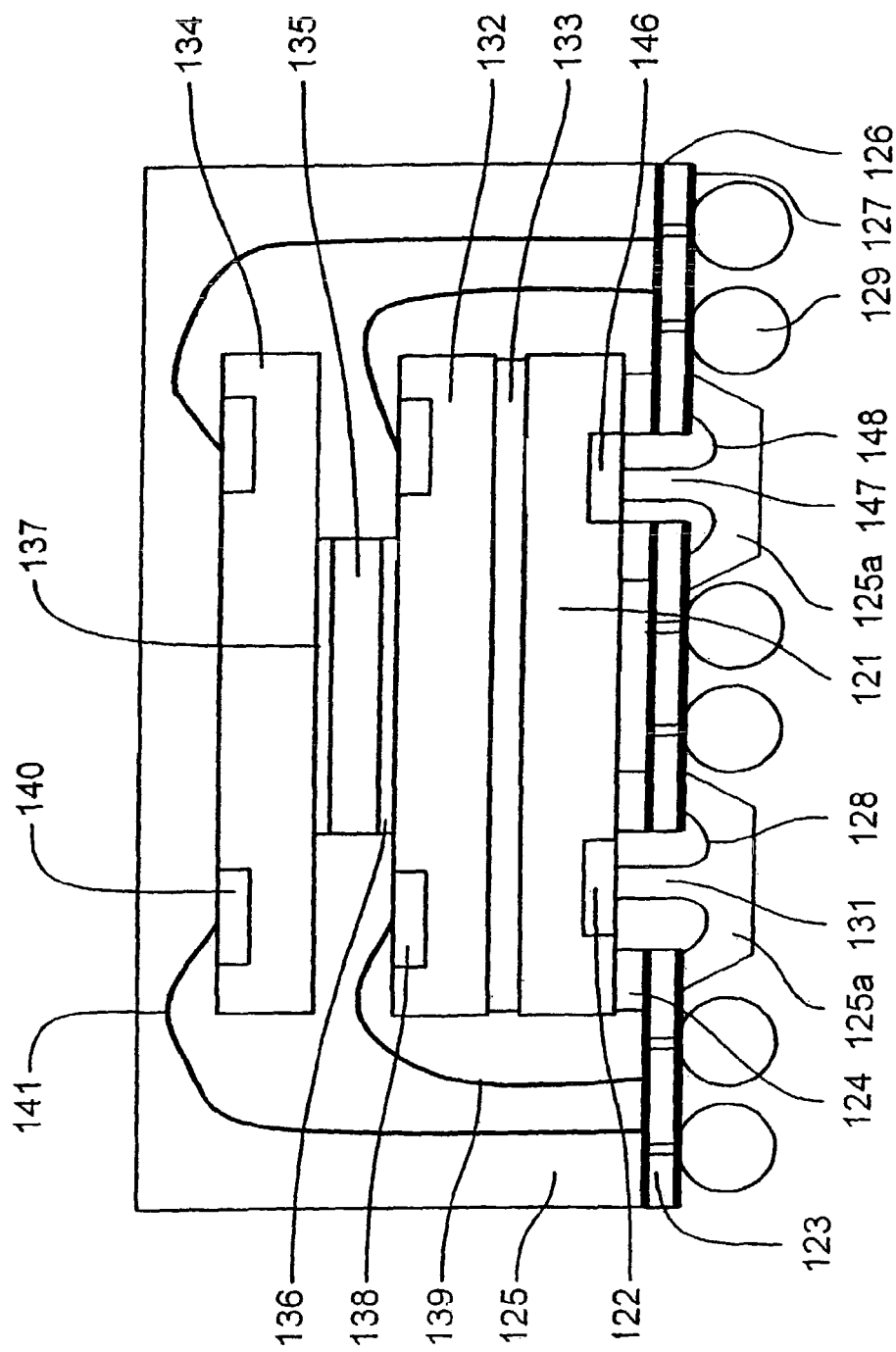
FIG. 7 is a sectional view of a further chip scale package that embodies the present invention.

FIG. 7 shows a semiconductor package 120 that is a variation of the semiconductor package 100 shown in FIG. 6. The semiconductor package 120 of FIG. 7 includes the IC device 121 attached by an adhesive 124 to a substrate 123. An additional IC device 134 is attached to the second IC device 132 by means of a spacer 135. The spacer 135 is attached to the second IC device 132 with adhesive 136 and to the third IC device with adhesive 137. The third IC device 134 has electrical contact regions 130 connected to the conductor tracings 126 on the substrate 123 by means of electrical connections 141. The spacer 135 is required to allow connections to be made to the second IC device 132 since the third IC device 134 is attached to the active face of the second IC device 132. In the semiconductor package 120 shown in FIG. 7, the spacer 135 is attached to the passive side of the third IC device 134. However, in appropriate circumstances, the third IC device 134 may be orientated the other way up, with the space 135 attached to the active face of the third IC device 134. This may result in a larger spacer 135 being required.

By the appropriate use of spacers and adhesive, any number of additional IC devices may be attached in this manner. Stacks of IC devices may be formed, for example, from pairs of IC devices, attached passive side to passive side and separated by spacers, or a plurality of IC devices, orientated the same way and each separated by spacers. Clearly, however, it may not be practical to add large numbers of IC devices due to restrictions on the electrical connections between the electrical contact regions on the IC devices and the electrical tracings on the substrate. A limit may also be reached on the number of solder balls that may be used to form the ultimate connections with the apparatus to which the semiconductor device is attached.

Although each of the exemplary semiconductor packages shown in FIGS. 3 through 7 show IC devices with electrical contact regions either in the centre of the active face or on the edges of the active face, the present invention is not limited to such arrangements. Additional or alternative electrical contact regions may be provided with the corresponding additional electrical connections between the electrical contact regions and the substrate. Likewise, where necessary, additional openings may be provided in the substrate for connecting the electrical contact regions on the first IC device to the substrate.

The adhesive used to attach the IC devices to the substrate and to one another may be in the form of an adhesive paste, coating or film. The electrical connections between the electrical contact regions and the substrate may be formed by a wire bond method or by a Tape Automatic Bonding (TAB) method. However the present invention is not limited to these methods. The electrical connections may be effected by any means capable of transferring signals between the IC device and the substrate. In addition, the first IC device may be coupled to the substrate by a flip chip method, which is well known in the art. The cover may be formed from a liquid encapsulant, that may be subsequently cured in an oven, or by a moulding process. Alternatively the cover may surround the semiconductor package but not encapsulate each of the components. Such a cover may, for example, be formed from glass, sealing the IC devices and connections from the environment.

Finally, although the embodiments shown in FIGS. 3 through 7 show semiconductor packages containing IC devices that are the same size, the present invention also encompasses semiconductor packages containing IC devices of varying sizes. This may, for example, be the case in semiconductor packages which contain IC devices of various types. In such circumstances there may also be electrical connections directly between different IC devices.

The present disclosure relates to subject matter contained in priority Singapore Patent Application No. 200201096-5, filed on Feb. 21, 2002, the contents of which is herein expressly incorporated by reference in its entirety.

The invention claimed is:

1. A semiconductor package comprising:
a first IC device;
a second IC device;
a substrate, the first IC device being attached to the substrate and the second IC device being attached to the first IC device;
a first electrical connection between the first IC device and the substrate;
a second electrical connection between the second IC device and the substrate;
an electrical contact distributor, attached to one of the first or second IC devices in the semiconductor package;
wherein an electrical connection is connected to an associated electrical contact region with the electrical contact distributor; and
wherein the electrical contact distributor comprises at least one of a wafer distribution layer; a substrate interposer; a dielectric interposer; and a metallic interposer;
an opening, through the substrate, from a first side of the substrate to which the first IC device is attached, to a second side of the substrate opposite the first side; and
an electrical contact region on the first IC device,
wherein said first electrical connection passes through said opening and connects said electrical contact region on the first IC device to the second side of the substrate; and
wherein said electrical contact region on the first IC device includes a row of electrical contact regions on the first IC device, said row located substantially centrally on a first side of the first IC device, to which the substrate is attached.

2. The semiconductor package according to claim 1, wherein the substrate is attached to a first major face of the first IC device and the second IC device is attached to a second major face of the first IC device.

3. A semiconductor package according to claim 1, wherein said electrical contact region on the first IC device is part of a first row of electrical contact regions on the first IC device; and the semiconductor package further comprises: a second opening through the substrate from the first side to the second side; a second row of electrical contact regions on the first IC device; and a third electrical connection, passing through said second opening and connecting an electrical contact region in said second row of electrical contact regions on the first IC device to the second side of the substrate.

4. A semiconductor package according to claim 3, wherein said first and second rows of electrical contact regions on the first IC device are located on mutually opposite edges of a first side of the first IC device, to which the substrate is attached.

5. The semiconductor package according to claim 1, further comprising an electrical contact region on the second IC device and said second electrical connection connects the electrical contact region on the second IC device to the substrate.

6. The semiconductor package according to claim 5, wherein said electrical contact region on the second IC device includes a first row of electrical contact regions on the second IC device; and the semiconductor package further comprises a second row of electrical contact regions on the second IC device and a third electrical connection that connects an electrical contact region in the second row of electrical contact regions on the second IC device to the substrate.

7. The semiconductor package according to claim 6, wherein said first and second rows of electrical contact regions on the second IC device are located on mutually opposite edges of a first side of the second IC device, which is on the other side of the second IC device to a second side, to which the first IC device is attached.

8. A semiconductor package according to claim 1, wherein said first electrical contact region on the second IC device is part of a row of electrical contact regions on the second IC device, said row located substantially centrally on a first side of the second IC device, which is on the other side of the second IC device to a second side, to which the first IC device is attached.

9. The semiconductor package according to claim 1, further comprising:
   at least a third IC device, the third IC device attached to the second IC device with a spacer; and
   at least one electrical connection that connects an electrical contact region on each of the IC devices to the substrate.

10. The semiconductor package according to claim 1, wherein the first IC device performs a different function than the second IC device.

* * * * *